(12) United States Patent
Kim et al.

(10) Patent No.: US 12,288,782 B2
(45) Date of Patent: Apr. 29, 2025

(54) CELL LAYOUTS

(71) Applicant: GLOBALFOUNDRIES U.S. Inc., Malta, NY (US)

(72) Inventors: Juhan Kim, Santa Clara, CA (US); Sangmoon J. Kim, San Jose, CA (US); Mahbub Rashed, Cupertino, CA (US); Navneet K. Jain, Milpitas, CA (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 462 days.

(21) Appl. No.: 17/679,655

(22) Filed: Feb. 24, 2022

(65) Prior Publication Data

US 2023/0268335 A1 Aug. 24, 2023

(51) Int. Cl.
*H01L 27/02* (2006.01)
*H01L 21/8234* (2006.01)
(Continued)

(52) U.S. Cl.
CPC ...... *H01L 27/0207* (2013.01); *H01L 21/8238* (2013.01); *H01L 29/4175* (2013.01);
(Continued)

(58) Field of Classification Search
CPC ........... H01L 27/0207; H01L 29/41758; H01L 27/092; H01L 21/823475;
(Continued)

(56) References Cited

U.S. PATENT DOCUMENTS

| 9,123,565 B2 | 9/2015 | Lu et al. |
| 2011/0140203 A1 | 6/2011 | Hou et al. |

(Continued)

FOREIGN PATENT DOCUMENTS

| TW | 201604866 | 2/2016 |
| TW | 201931519 | 8/2019 |

(Continued)

OTHER PUBLICATIONS

Lacord et al. "Fast evaluation of continuous-RX on performance of strained FDSOI", 2017 The Japan Society of Applied Physics, 4 pages.

(Continued)

*Primary Examiner* — Joseph C. Nicely
*Assistant Examiner* — Alvin L Lee
(74) *Attorney, Agent, or Firm* — David Cain; Andrew M. Calderon; Calderon Safran & Wright P.C.

(57) ABSTRACT

The present disclosure relates to semiconductor structures and, more particularly, to cell layouts in semiconductor structures and methods of manufacture. A structure includes: a plurality of abutting cells each of which include transistors with gate structures having diffusion regions; a contact spanning across abutting cells of the plurality of abutting cells and contacting to the diffusion regions of separate cells of the abutting cells; and a continuous active region spanning across the plurality of abutting cells, wherein the continuous active region includes a drain-source abutment with L-shape construct, a source-source abutment with U-shape construct, and a drain-drain abutment with a filler cell located between a drain-drain abutment.

19 Claims, 5 Drawing Sheets

(51) Int. Cl.
  *H01L 21/8238* (2006.01)
  *H01L 27/092* (2006.01)
  *H01L 27/118* (2006.01)
  *H01L 29/417* (2006.01)

(52) U.S. Cl.
  CPC ..... *H01L 29/41758* (2013.01); *H01L 21/823475* (2013.01); *H01L 27/092* (2013.01); *H01L 2027/11831* (2013.01)

(58) Field of Classification Search
  CPC ....... H01L 2027/11831; H01L 21/8238; H01L 29/4175
  See application file for complete search history.

(56) References Cited

U.S. PATENT DOCUMENTS

| | | | |
|---|---|---|---|
| 2013/0027083 A1 | 1/2013 | Ando et al. | |
| 2014/0001563 A1* | 1/2014 | Rashed | H01L 27/0207 257/E27.06 |
| 2015/0221639 A1* | 8/2015 | Chen | G06F 30/39 257/368 |
| 2016/0079167 A1* | 3/2016 | Zhu | H01L 23/535 257/390 |
| 2017/0358565 A1 | 12/2017 | Hensel et al. | |
| 2019/0148352 A1 | 5/2019 | Chang et al. | |
| 2019/0189055 A1 | 6/2019 | Zhang et al. | |
| 2019/0237542 A1* | 8/2019 | Chen | H01L 23/5283 |
| 2019/0386000 A1* | 12/2019 | Chen | H01L 29/0649 |
| 2020/0134123 A1 | 4/2020 | Wang et al. | |
| 2021/0343777 A1 | 11/2021 | Otake et al. | |
| 2021/0407985 A1* | 12/2021 | Chen | G06F 30/392 |

FOREIGN PATENT DOCUMENTS

| | | |
|---|---|---|
| TW | 201935695 | 9/2019 |
| TW | 202018834 | 5/2020 |
| TW | 202121607 | 6/2021 |
| TW | 202137313 | 10/2021 |

OTHER PUBLICATIONS

German Office Action issued Nov. 21, 2023 in related German Application No. 10 2022 134 873.3, 11 pages.
Brief English Translation of the German Office Action issued Nov. 21, 2023 in DE Application No. 10 2022 134 873.3, 3 pages.
Taiwanese Office Action dated Nov. 3, 2023 in TW Application No. 112103082 with Google Machine Translation, 4 pages.
Notice of Preliminary Rejection dated Nov. 28, 2024 in KR Application No. 10-2023-0010594 with Google Machine Translation, 10 pages.

* cited by examiner

CELL LAYOUTS

BACKGROUND

The present disclosure relates to semiconductor structures and, more particularly, to cell layouts in semiconductor structures and methods of manufacture.

In standard cell layouts for certain technology nodes, a PFET and NFET can be provided; however, in such standard cell layouts, the PFET performance may be much lower than the NFET. This is due to the use of a SiGe channel in the PFET which induces a strong local layout effect when the active region is not continuously extended in abutment.

SUMMARY

In an aspect of the disclosure, a structure comprises: a plurality of abutting cells each of which include transistors with gate structures having diffusion regions; a contact spanning across abutting cells of the plurality of abutting cells and contacting to the diffusion regions of separate cells of the abutting cells; and a continuous active region spanning across the plurality of abutting cells, wherein the continuous active region comprises a drain-source abutment with L-shape construct, a source-source abutment with U-shape construct, and a drain-drain abutment with a filler cell located between the drain-drain abutment.

In an aspect of the disclosure, a structure comprises: abutting cell layouts each of which include a source region and a drain region on opposing sides of a gate structure; a continuous active region spanning across PFET regions of the abutting cell layouts; and at least one contact spanning across the abutting cell layouts and connecting source regions of first abutting cell layouts and connecting a source region and a drain region of second abutting cell layouts.

In an aspect of the disclosure, a method comprises: forming a plurality of abutting cells each of which include transistors with gate structures having diffusion regions; forming a contact spanning across abutting cells of the plurality of abutting cells and contacting to the diffusion regions of separate cells of the abutting cells; and forming a continuous active region spanning across the plurality of abutting cells, wherein the continuous active region comprises a drain-source abutment with L-shape construct, a source-source abutment with U-shape construct, and a drain-source abutment with a filler cell located between a drain-drain abutment.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to cell layouts in semiconductor structures and methods of manufacture. More specifically, the present disclosure relates to standard cell layouts with continuous active regions in a PFET. Advantageously, the present disclosure provides cell layouts with improved PFET performance that can be used in nodes in fully depleted semiconductor (silicon) on insulator (FDSOI) applications.

In embodiments, a semiconductor device comprises a plurality of standard cells defined with a source diffusion region and a drain diffusion region. An improved source-source abutment and a source-drain abutment configuration are provided in a continuous active region of a PFET, i.e., in SiGe channels in FDSOI PFETs, with a drain-drain abutment restricted. For example, in embodiments, the source diffusion region and the drain diffusion region comprise an active contact (CA) and a polysilicon contact (CB) with a continuous active layer (CnRX) marker to pass a layout connectivity check. In the source-drain abutment configuration, the active contact (CA) and polysilicon contact (CB) are configured in an L-shape construct. In further embodiments, two L-shape constructs may be configured into a U-shaped construct in a source-source abutment configuration. In the drain-drain configuration, a filler cell may be inserted between two active cells to convert the drain-drain abutment to a source-drain abutment with an L-shape construct. Accordingly, a drain-drain abutment is restricted, i.e., not allowed.

Figure 1A:
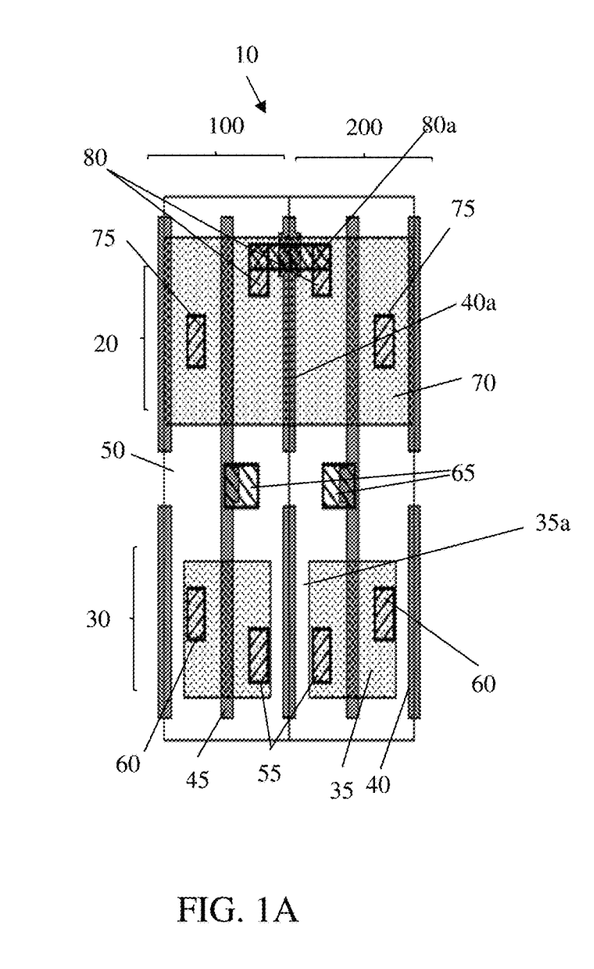
FIG. 1A shows a cell layout at a macro level with a source-source abutment in accordance with aspects of the present disclosure.

FIG. 1A shows a cell layout at a macro level with a source-source abutment in accordance with aspects of the present disclosure. In particular, the cell layout 10 of FIG. 1A shows a source-source abutment. More specifically, the cell layout 10 of FIG. 1A shows active cells 100, 200 in abutment to one another. The cells 100, 200 each a include PFET region 20 and NFET region 30. The PFET region 20 and NFET region 30 include multiple gate structures 40 and 45. The gate structures 40 each include a cut or break 50 between the PFET region 20 and the NFET region 30 of each of the cells, whereas the gate structures 45 are continuous gate structures spanning over both the PFET region 20 and the NFET region 30. The gate structures 40a may be shared between adjacent active cells, e.g., cells 100, 200.

Still referring to FIG. 1A, the NFET regions 30 may include discontinuous active regions 35. The discontinuous active regions 35 include a diffusion break 35a between each active diffusion region 35, where each active diffusion region (e.g., Rx region) 35 includes a source diffusion region (and respective active contact) 55 and drain diffusion region (and active contact) 60 on respective sides of the gate structures 40, 45. The gate structures 45 for each active cell 100, 200 also include a gate contact 65 between the PFET region 20 and the NFET region 30. As in each of the embodiments, the active contacts (CA) may comprise a metal material, e.g., aluminum, copper, etc. with an optional liner material, e.g., TaN or TiN). The gate contact 65 may be a polysilicon material (CB), as is known in the art.

The PFET regions 20 include a continuous active region (e.g., Rx region) 70 spanning over multiple gate structures 40, 45 and multiple active cells 100, 200. The continuous active region 70 may be SiGe material, spanning over the multiple gate structures 40, 45. In this way, the channel regions of the gate structures 40, 45 may be SiGe material. As should be understood, the continuous active layer 70 will improve the performance of the PFET device with the SiGe channel.

The gate structures 40, 45 also include drain diffusion regions (and respective active contacts) 75 and abutting source diffusion regions (and respective active contacts) 80, with a source contact 80a spanning between and connecting to the abutting source diffusion regions 80 (e.g., source-source abutment) of the abutting active cells 100, 200. In embodiments, the source contact 80a may be polysilicon material.

In more specific embodiments, the abutting source contact 80a may be polysilicon material spanning between the two contacts 80, forming a U-shaped contact with the active contacts 80 of the source diffusion regions. More specifically, the active contacts 80 may be a metal material, with a bridge (e.g., abutting source contact 80a) connecting the active contacts being the polysilicon material. In this way, a U-shaped contact construct is spans over the two abutting active cells 100, 200. In embodiments, the gate structure 40a may act as a CnRx marker, for example.

Figure 1B:
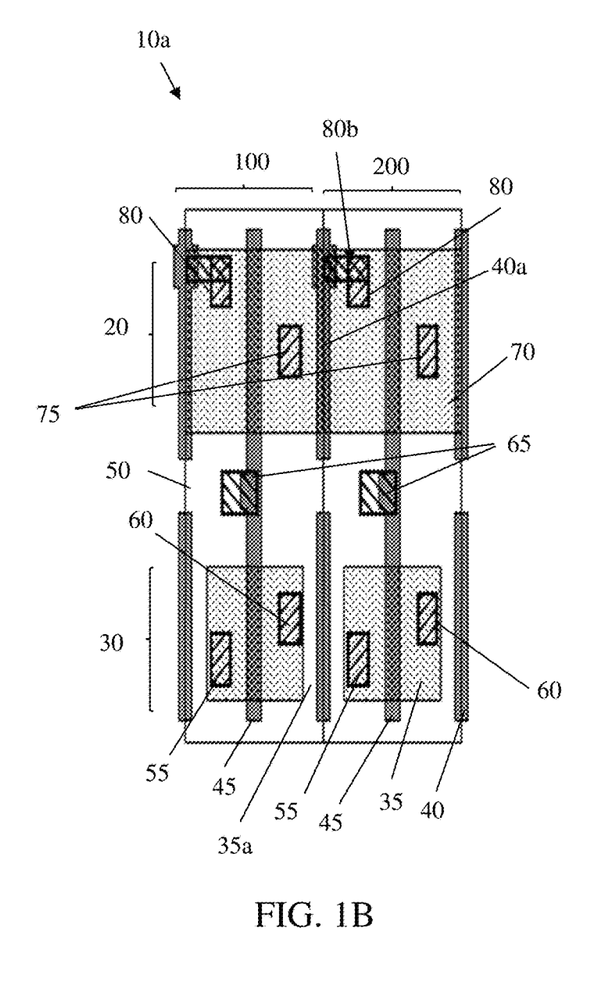
FIG. 1B shows a cell layout at a macro level with a source-drain abutment in accordance with aspects of the present disclosure.

FIG. 1B shows a cell layout at a macro level with a source-drain abutment in accordance with aspects of the present disclosure. More specifically, the cell layout 10a of FIG. 1B shows active cells 100, 200 in abutment to one another. The cells 100, 200 each a include PFET region 20 and NFET region 30. The PFET region 20 and NFET region 30 include multiple gate structures 40, 45. The gate structures 40 each include a cut or break 50 between the PFET regions 20 and the NFET regions 30, whereas the gate structures 45 are continuous gate structures spanning over the PFET region 20 and the NFET region 30. The gate structures 40a may be shared between adjacent cells, e.g., cells 100, 200.

Still referring to FIG. 1B, the NFET regions 30 include discontinuous active diffusion regions 35 (with a diffusion break 35a), where each active diffusion region 35 includes a source diffusion region (and respective active contact) 55 and a drain diffusion region (and respective active contact) 60 on respective sides of the gate structures 40, 45. The gate structures 45 also include a gate contact 65 between the PFET region 20 and the NFET region 30. As already noted herein, the active contacts for the source and drain material may be a metal material and the gate contact 65 may be a polysilicon material.

The PFET regions 20 include a continuous active region 70 spanning over multiple gate structures 40, 45 and the active cells 100, 200. The continuous active region 70 may be SiGe material. In this way, the channel region of the gate structures 40, 45 for the PFET implementation may be SiGe material. The continuous active region 70 includes drain diffusion regions (and respective active contacts) 75 and source diffusion regions (and respective active contacts) 85. In this embodiment, the source diffusion region abuts the drain diffusion region (e.g., source-drain abutment) of abutting active cells 100, 200.

In embodiments, a source-drain contact 80b may be provided between the source diffusion region (e.g., active contact) 80 and drain diffusion region (e.g., active contact) 75 of abutting cells 100, 200. The source-drain contact 80b may be an L-shaped contact comprising polysilicon material and the active contact (metal material) of the source diffusion region of the abutting, active cell. In embodiments, the gate structure 40a may act as a CnRx marker, for example.

Figure 1C:
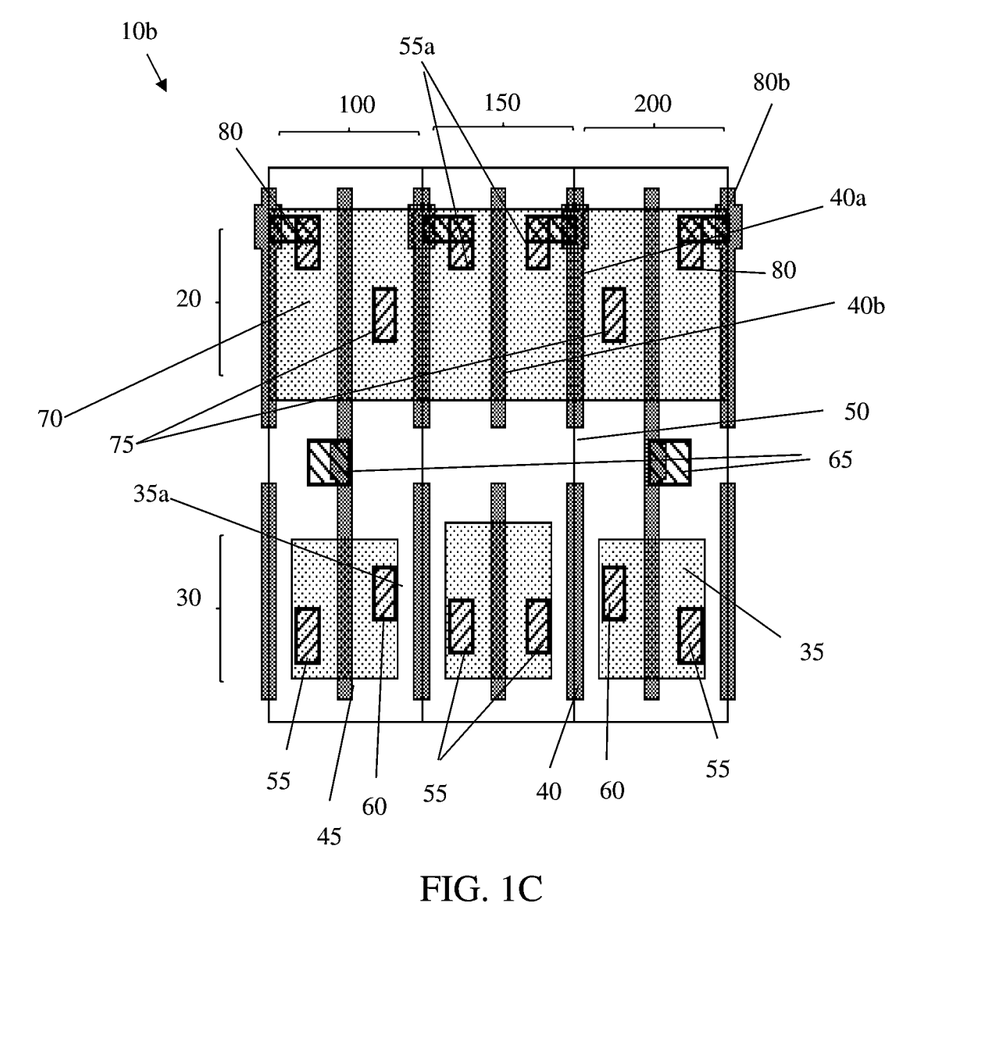
FIG. 1C shows a cell layout at a macro level with a source-drain abutment with a filler cell in accordance with aspects of the present disclosure.

FIG. 1C shows a cell layout at a macro level with a filler cell in accordance with aspects of the present disclosure. In particular, the cell layout 10b of FIG. 1C shows a drain-filler-drain abutment. In this configuration, for example, a drain-to-drain abutment is restricted, e.g., avoided. More specifically, the cell layout 10b of FIG. 1C shows active cells 100, 200 and a filler cell 150 in abutment with and between the active cells 100, 200. In this way, the cell layout avoids a drain-to-drain abutment.

The cells 100, 150 200 each include a PFET region 20 and NFET region 30. The PFET region 20 and NFET region 30 include multiple gate structures 40 and 45. The gate structures 40 each include a cut or break 50 between the PFET regions 20 and the NFET regions 30, whereas the gate structures 45 are continuous gate structures spanning over both the PFET region 20 and the NFET region 30. In the filler cell 150, the gate structures 40b are floating gate structures. Also, in this embodiment, the gate structures 40a may be shared between adjacent cells, e.g., cells 100, 150, 200.

Still referring to FIG. 1C, the NFET regions 30 of cells 100, 200 include discontinuous active regions 35, each of which include source diffusion regions (and active contacts) 55 and drain diffusion regions (and active contacts) 60 on respective sides of the gate structures, 40, 45. The gate structures 45 also include a gate contact 65 between the PFET region 20 and the NFET region 30. In embodiments, the gate contact 65 may be a polysilicon material, as an example.

The PFET regions 20 include a continuous active region 70 spanning over multiple gate structures 40, 40a, 40b, 45 and cells 100, 150, 200. The continuous active region 70 may be SiGe material which act as a channel region of the respective active gate structures. The continuous active region 70 includes drain diffusion regions (and respective active contacts) 75 and source diffusion regions (and respective active contacts) 85 for the active cells 100, 200 and source diffusion regions 55a for the filler cell 150. In this way, the source diffusion regions 55a of the filler cell 150 abut to the drain diffusion regions (and active contacts) 75 of the active cells 100, 200, e.g., preventing the drain-to-drain abutment. In embodiments, an L-shaped source to drain contact 80b comprises a leg composed of polysilicon material connecting to the active contacts of source diffusion region 55a of the filler cell 150 and the drain diffusion region 75 of abutting active cells 100, 200.

Figure 2A:
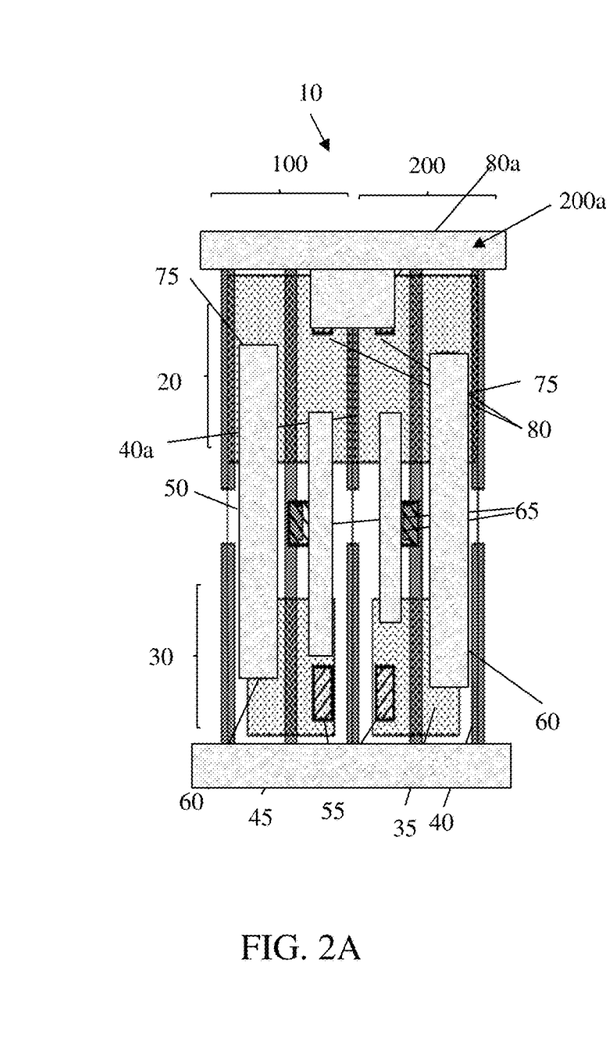
FIGS. 2A-2C show the cell layouts of FIGS. 1A-1C with a metal wiring layer in accordance with aspects of the present disclosure.
Figure 2B:
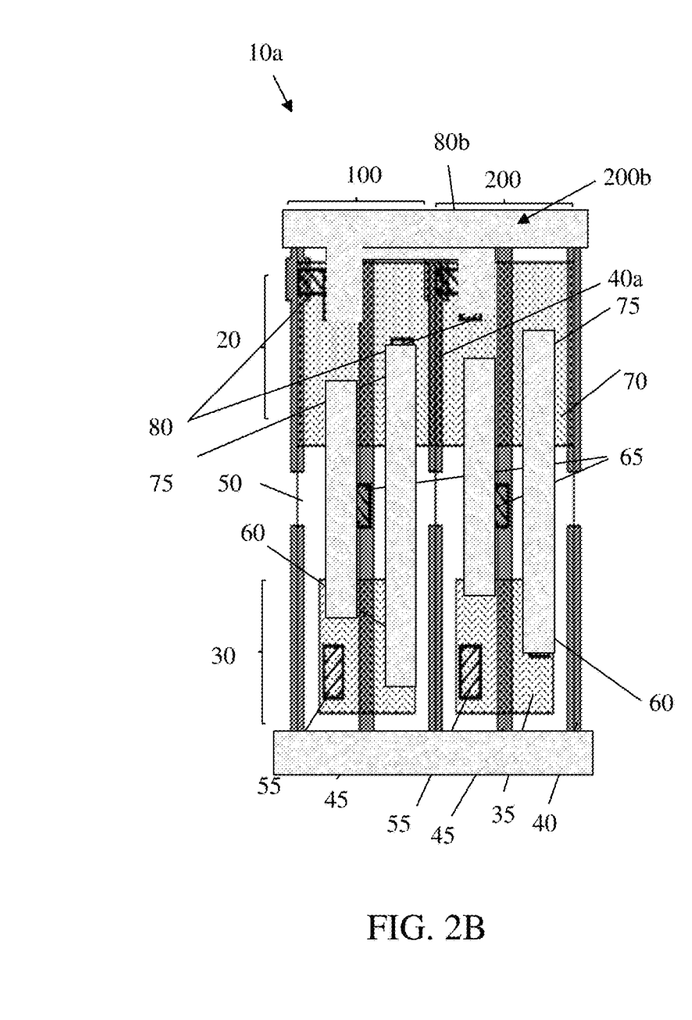
Figure 2C:
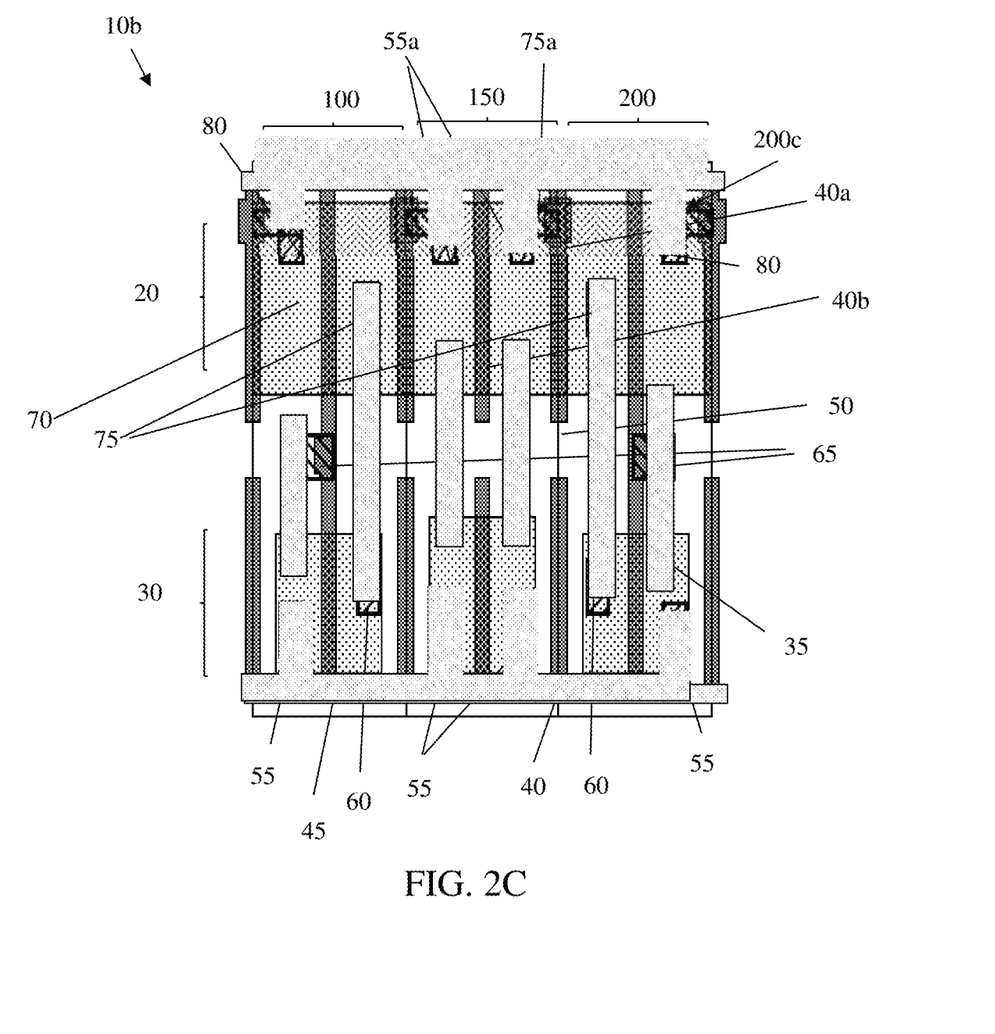

FIGS. 2A-2C show the cell layouts at the macro level of respective FIGS. 1A-1C with wiring layers to the different source, drain and gate contacts. For example, in FIG. 2A, a common wiring 200a connects the U-shaped source contact 80a of the active cells 100, 200. The common wiring 200a would also connect to U-shaped source contacts 80a of other active cells 100, 200. Similarly, in FIG. 2B, a common wiring 200b connects the L-shaped contacts 80b of the active cells 100, 200. Also, in FIG. 2C, a common wiring 200c connects the L-shaped contacts 75a of the active cells 100, 200 and the filler cell 150. It should also be understood by those of ordinary skill in the art, that wiring layers may be used to connect the source and drain diffusion regions of the NFETs and PFETs, in addition to the contacts to the gate structures 40 spanning between the NFETs and PFETs. In each of these embodiments, the wiring 200a, 200b, 200c may be a metal wiring and a via contact, with the metal wiring in a first wiring level of interlevel dielectric material. The wiring 200a, 200b, 200c may be tungsten material with liner material, e.g., TiN or TaN, as non-limiting examples.

Figure 3:
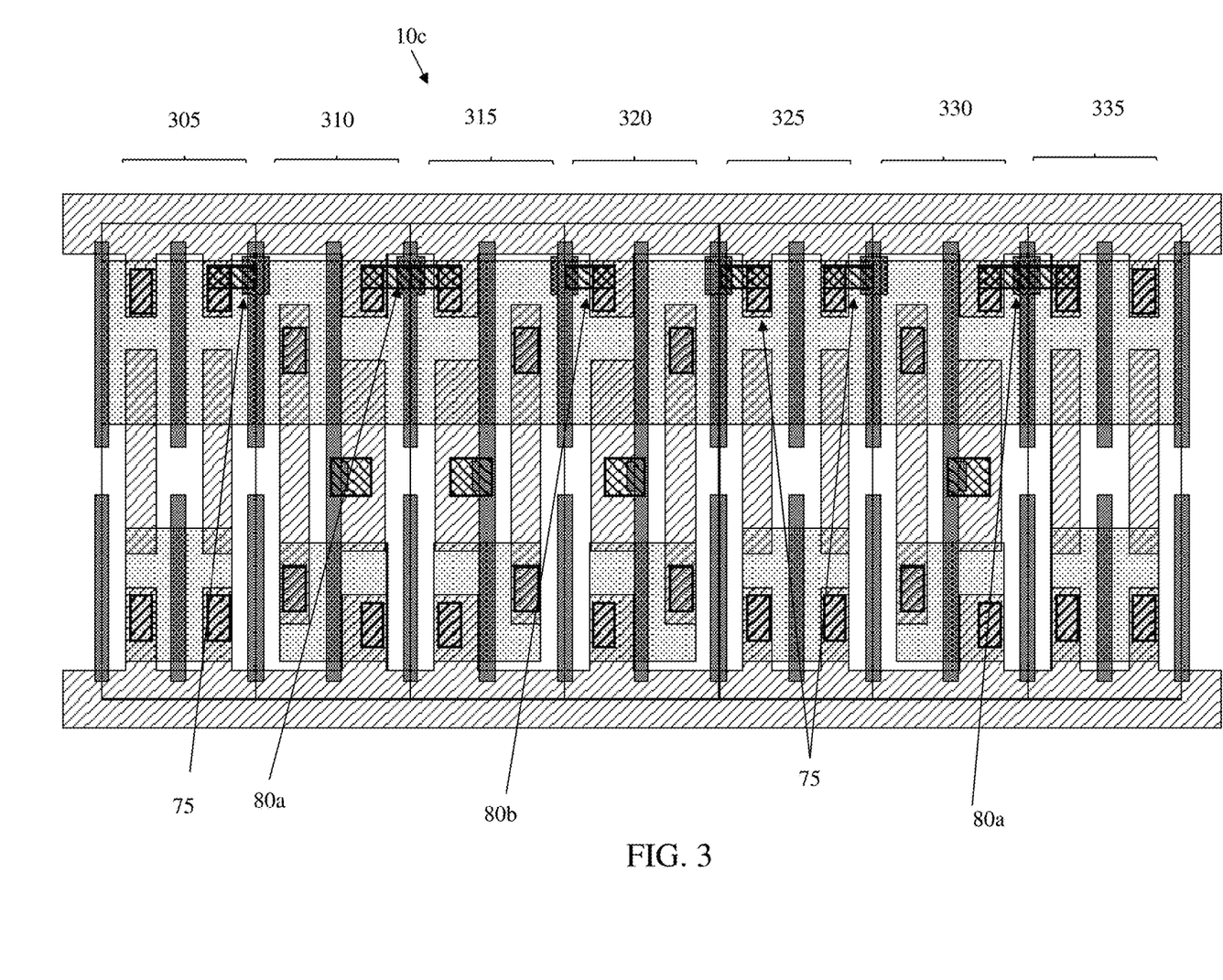
FIG. 3 shows a layout of several cells in accordance with aspects of the present disclosure.

FIG. 3 shows the cell layout at the macro level of different cells shown in FIGS. 1A-2C in series abutting one another, with wiring layers to the different source, drain and gate contacts. It should be understood by those of skill in the art that the cell layout 10c of FIG. 3 is merely provided as an example and that other cell layouts are contemplated by the present disclosure. In this cell layout configuration, the cell layout 10c includes the cells 305, 310, 315, 320, 325, 330, 335. In this exemplary embodiment, the cells 305, 310, 315, 320, 330, 335 are active cells and the cell 325 is a fill cell. The L-shaped construct 80b spans between cells 305, 310 and spans between cells 315, 320 for source-drain abutment configurations; whereas the U-shaped construct 80a span between cells 310, 315 and span between cells 330, 335 for source-source abutment configurations. The cells which abut to the fill cell 325 also show an L-shaped construct 75a for source-drain abutment configurations to avoid the drain-drain abutments.

The standard cell layouts of the present disclosure can be manufactured in a number of ways using a number of different tools. In general, though, the methodologies and tools are used to form structures with dimensions in the micrometer and nanometer scale. The methodologies, i.e., technologies, employed to manufacture the standard cell layouts of the present disclosure have been adopted from integrated circuit (IC) technology. For example, the structures are built on wafers and are realized in films of material patterned by photolithographic processes on the top of a wafer. In particular, the fabrication of the standard cell layouts uses three basic building blocks: (i) deposition of thin films of material on a substrate, (ii) applying a patterned mask on top of the films by photolithographic imaging, and (iii) etching the films selectively to the mask. In addition, precleaning processes may be used to clean etched surfaces of any contaminants, as is known in the art. Moreover, when necessary, rapid thermal anneal processes may be used to drive-in dopants or material layers as is known in the art.

More specifically, in embodiments, the substrate for the active regions 20, 30 may be composed of SiGe; however, other suitable materials may also be contemplated including, but not limited to, Si, SiGeC, SiC, GaAs, InAs, InP, and other III/V or II/VI compound semiconductors. Moreover, in embodiments, the substrate may be semiconductor on insulator (SOI) technology and, more specifically, fully depleted SOI (FDSOI). The gate structures 40, 45 may be FinFET structures formed by conventional lithography, etching and deposition methods such as sidewall image techniques (SIT) or Self-aligned double patterning (SADP) processes as is known in the art.

The source and drain diffusion regions 55, 55a, 60, 75, 80 may be provided by, for example, ion implantation processes or doped epitaxial processes to form raised source and drain diffusion regions 55, 55a, 60, 75, 80, as known in the art such that no further explanation is required for a complete understanding of the present disclosure. A silicide may be provided on the source and drain diffusion regions 55, 55a, 60, 75, 80 prior to formation of the active contacts. The silicide process begins with deposition of a thin transition metal layer, e.g., nickel, cobalt or titanium, over fully formed and patterned source and drain diffusion regions, followed by a thermal anneal process to form a low-resistance transition metal silicide.

The active gate contacts and metal wirings may be formed by conventional lithography, etching and deposition methods known to those of skill in the art. For example, a resist formed over insulator material is exposed to energy (light) to form a pattern (opening). An etching process with a selective chemistry, e.g., reactive ion etching (RIE), will be used to form one or more trenches in the insulator material through the openings of the resist. Following the resist removal by a conventional oxygen ashing process or other known stripants, conductive material can be deposited by any conventional deposition processes, e.g., chemical vapor deposition (CVD) processes. Any residual material on the surface of the insulator material can be removed by conventional chemical mechanical polishing (CMP) processes.

The cell layouts can be utilized in system on chip (SoC) technology. The SoC is an integrated circuit (also known as a "chip") that integrates all components of an electronic system on a single chip or substrate. As the components are integrated on a single substrate, SoCs consume much less power and take up much less area than multichip designs with equivalent functionality. Because of this, SoCs are becoming the dominant force in the mobile computing (such as in Smartphones) and edge computing markets. SoC is also used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   a plurality of abutting cells each of which include transistors with gate structures having diffusion regions;
   a contact spanning across abutting cells of the plurality of abutting cells and contacting to the diffusion regions of separate cells of the abutting cells; and
   a continuous active region spanning across the plurality of abutting cells,
   wherein the continuous active region comprises a drain-source abutment with L-shape construct, a source-source abutment with U-shape construct which comprises active contacts of source diffusion regions of a first set of cells of the plurality of abutting cells and which spans over a gate structure between the first set of adjacent abutting cells, and filler cell located between a second set of cells of the plurality of abutting cells that have a drain-drain facing configuration and which restricts drain-drain abutment.

2. The structure of claim 1, wherein the continuous active region spans across PFET regions of the abutting cells.

3. The structure of claim 2, wherein the U-shape construct comprises a U-shaped contact connecting to active source regions of the source-source abutment and wherein the U-shaped contact comprises a portion of polysilicon material.

4. The structure of claim 3, wherein the L-shape construct comprises an L-shaped contact connecting active source and drain regions of the source-drain abutment.

5. The structure of claim 4, wherein the L-shaped contact comprises a portion of polysilicon material.

6. The structure of claim 3, wherein the filler cell comprises source regions each of which abut to a drain region of opposing active cells of the plurality of abutting cells.

7. The structure of claim 6, further comprising an L-shaped contact spanning and contacting to a drain-source abutment between the filler cell and each of the opposing active cells of the plurality of abutting cells.

8. The structure of claim 7, wherein the L-shaped contact comprising polysilicon material spanning between each source region of the filler cell and the drain region of the opposing active cells of the plurality of abutting cells.

9. The structure of claim 6, wherein the filler cell restricts a drain-drain abutment between the opposing active cells of the plurality of abutting cells.

10. The structure of claim 1, wherein the filler cell includes a floating gate structure between the source regions.

11. A structure comprising:
abutting cell layouts;
a continuous active region spanning across PFET regions of the abutting cell layouts; and
at least one contact spanning across the abutting cell layouts and connecting source regions of first abutting cell layouts and connecting a source region and a drain region of second abutting cell layouts, wherein the at least one contact comprises a U-shaped contact that comprises active contacts connecting to the source regions and extending over a gate structure of adjacent cells of the abutting cell layouts,
wherein the abutting cell layouts comprise active cells and at least one filler cell abutting the active cells on opposing sides, the filler cell comprising source regions each of which abut to a drain region of the active cells such that a drain-to-drain abutment is avoided between the two of the active cells.

12. The structure of claim 11, wherein the U-shaped contact comprises polysilicon material.

13. The structure of claim 11, wherein the at least one contact comprises an L-shaped contact connecting to the abutting source and drain regions of the abutting cell layouts.

14. The structure of claim 13, wherein the L-shaped contact comprises polysilicon material.

15. The structure of claim 11, wherein a contact spanning between the filler cell and the active cells comprise L-shaped contacts spanning between the source region of the filler cell and the drain regions of the abutting active cells.

16. The structure of claim 11, wherein the at least one contact comprises plural contacts each of which contact between the source region and the drain region of abutting cell layouts and drain regions between other abutting cell layouts.

17. The structure of claim 16, further comprising a common wiring connecting to the plural contacts.

18. A method comprising:
forming a plurality of abutting cells each of which include transistors with gate structures having diffusion regions;
forming a contact spanning across abutting cells of the plurality of abutting cells and contacting to the diffusion regions of separate cells of the abutting cells; and
forming a continuous active region spanning across the plurality of abutting cells,
wherein the continuous active region comprises a drain-source abutment with L-shape construct, a source-source abutment with U-shape construct which comprises active contacts of source diffusion regions of a first set of cells of the plurality of abutting cells and which spans over a gate structure between the first set of adjacent abutting cells, and a filler cell located between a second set of cells of the plurality of abutting cells that have a drain-drain facing configuration and which restricts drain-drain abutment.

19. The structure of claim 1, wherein the U-shape construct which comprises the active contacts of the source diffusion regions further includes a wiring level on a different level that connects to the active contacts, the wiring level spanning over the gate structure.

* * * * *